(12) United States Patent
Brady et al.

(10) Patent No.: US 6,326,830 B1
(45) Date of Patent: Dec. 4, 2001

(54) AUTOMATIC CLOCK CALIBRATION CIRCUIT

(75) Inventors: Gary Brady, Aloha; Roger R Rees, Beaverton; Jerry Moberly; Pete Nevard, both of Hillsboro, all of OR (US); Christopher P. Swider, Evanston, IL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,145

(22) Filed: Dec. 29, 2000

(51) Int. Cl.$^7$ ........................................ H03K 3/00
(52) U.S. Cl. .................................. 327/293; 327/47
(58) Field of Search ...................... 327/41, 43, 44, 327/46, 47, 261–263, 269, 271, 276, 284, 291, 292, 293, 295, 296, 144, 145, 152, 161

(56) References Cited

U.S. PATENT DOCUMENTS

| 5,077,686 | * | 12/1991 | Rubinstein | 395/550 |
| 5,548,621 | * | 8/1996 | Brady et al. | 375/354 |
| 5,598,156 | * | 1/1997 | Hush et al. | 341/100 |
| 5,963,069 | * | 10/1999 | Jefferson et al. | 327/149 |
| 6,075,832 | * | 6/2000 | Geannopoulos et al. | 375/375 |
| 6,173,432 | * | 1/2001 | Harrison | 327/158 |

* cited by examiner

*Primary Examiner*—My-Trang Nu Ton
(74) *Attorney, Agent, or Firm*—Antonelli, Terry, Stout, Kraus, LLP

(57) ABSTRACT

An automatic clock calibration circuit includes a source of clock signals and an equal number of corresponding clock reference signals. Corresponding delay elements are connected between the source and the load driven by each of the clock signals. A phase frequency detector detects the phase differences between each clock signal, at the point at which it is applied to its load, and its corresponding clock reference signal. A microcontroller adjusts the delay of the delay elements according to the detected phase differences.

18 Claims, 2 Drawing Sheets

AUTOMATIC CLOCK CALIBRATION CIRCUIT

BACKGROUND

1. Field of the Invention

This invention relates generally to clocking systems. In particular, the present invention relates to computers with a multiple clock signal distribution network.

2. Description of the Related Art

Computer systems typically include clock generator sources that have multiple clock signal outputs with multiple frequencies. Although such clock generator sources are commercially available in the form of integrated circuit (IC) chips, computer systems (especially large computer systems such as servers) frequently need more clock signal outputs than the limited number provided by a single chip. They therefore use a multiple chip clock distribution network consisting of a plurality of "fanout" ICs that receive a single input clock signal and drive a plurality of clock output signals.

Regardless of the number of clock output signals, they must all arrive at their respective loads in phase within a small skew window from each other. A skew window on the order of a few hundred pico-seconds (ps) is difficult to achieve because the input to output propagation delays between different fanout ICs are usually several times larger than the targeted skew window.

A common solution to this problem incorporates commercially available programmable delay chips in the multiple chip clock distribution network. With step sizes down to 20 ps, these programmable delay chips allow the clock signals in a computer system to be de-skewed manually. Delay can be added to clocks coming from fanout ICs having shorter propagation delays to compensate for fanout ICs with longer propagation delays in the distribution network. But even with only a few programmable delay chips in the computer system the process of manually calibrating the clock signals by taking repeated skew measurements and then adjusting (usually via DIP switches) the programmable delays can be quite time consuming. Additionally, changes in temperature and voltage affect each fanout IC differently resulting in an unacceptable skew between the different fanout ICs even though a manual calibration has been successfully performed.

BRIEF SUMMARY

An automatic clock calibration circuit includes a source of clock signals and an equal number of corresponding clock reference signals. Corresponding delay elements are connected between the source and the load driven by each of the clock signals. A phase frequency detector detects the phase differences between each clock signal, at the point at which it is applied to its load, and its corresponding clock reference signal. A microcontroller adjusts the delay of the delay elements according to the detected phase differences.

DETAILED DESCRIPTION

This application describes an automatic clock calibration circuit adapted for use in a validation system for validating the proper operation of a computer system. However, such circuit, and the use of such a circuit in a server system, is merely exemplary. There are various possible embodiments of the invention which may of course be used in systems other than a validation system for validating the proper operation of a computer system.

Figure 1:
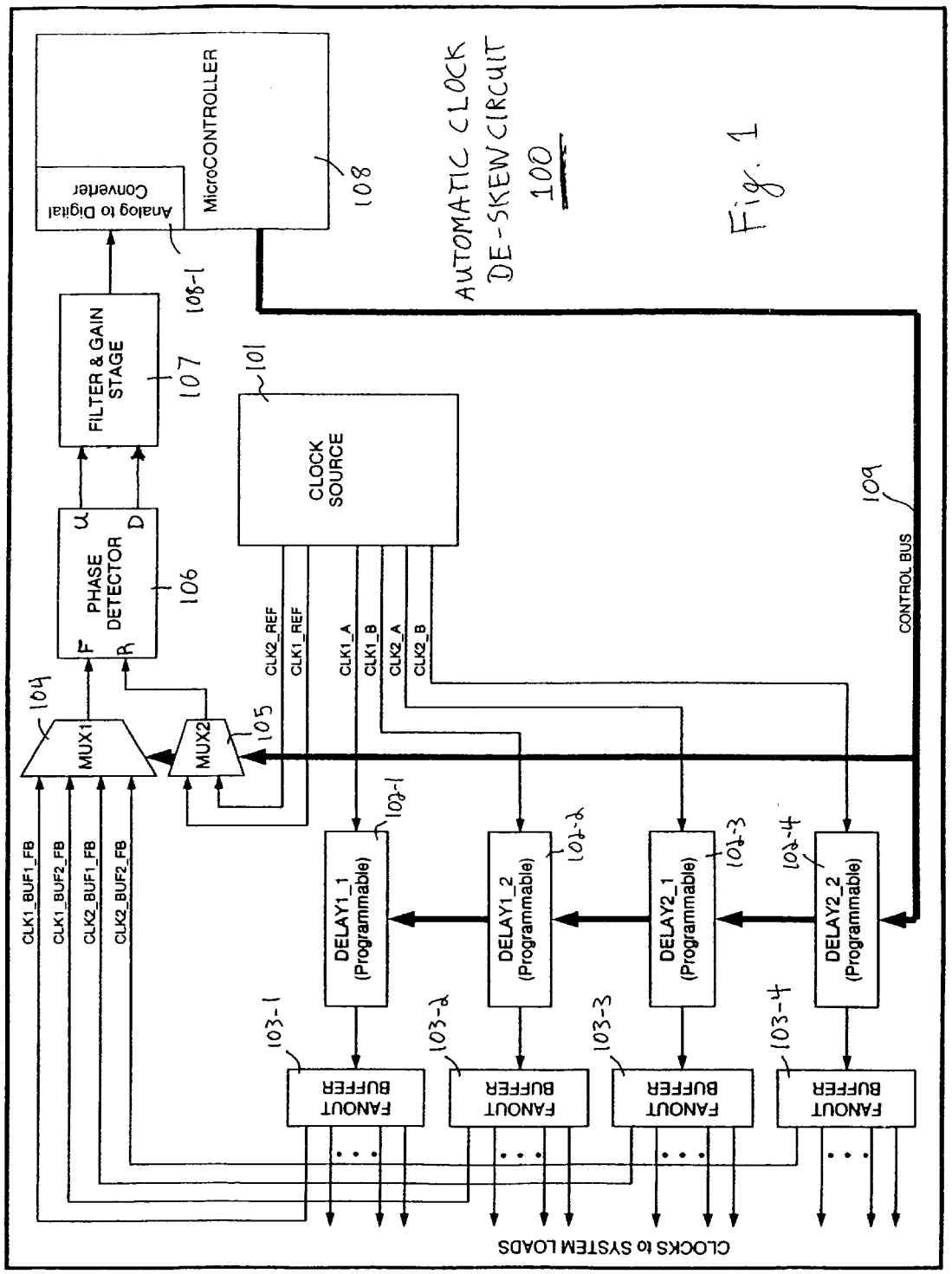
FIG. 1 is a diagram illustrating an automatic clock deskew circuit according to an example embodiment of the invention.

FIG. 1 illustrates an automatic clock de-skew circuit 100 according to an example embodiment of the invention. Only two clock frequencies and a limited number of clock output signals are shown in FIG. 1 merely for the sake of clarity. A clock signal distribution network could, of course, have more clock frequencies and clock output signals.

Clock Source 101 generates clock signals CLK1 and CLK2, and corresponding reference clock signals CLK1_REF and CLK2_REF. Clock source 101 may be a programmable PLL clock generator IC chip. (Although illustrated as a single block, clock source 101 need not be a programmable PLL clock generator or a single IC chip, but may comprise any combination of elements for providing the clock signals desired for the system.) Since there are four fanout buffers 103-1 to 103-4, two copies of each of the two clock signals are provided and each one of the resulting four clock signals (CLK1_A, CLK1_B, CLK2_A, CLK2_B) is provided to a corresponding one of the four fanout buffers 103-1 to 103-4 via a programmable delay chip 102-1 to 102-4. (In any given computer system, the number of clock loads in the system dictates how many fanout buffers are required. The number of required fanout buffers in turn dictates the number of copies of clock signals that are required. In large systems, there may be clock loads in excess of 100.)

The clock outputs of fan-out buffers 103-1 to 103-4 are routed in precisely matched lengths to corresponding system loads (not shown). These system loads may be located throughout a computer system. Indeed, the automatic clock calibration circuit shown in FIG. 1 may be located on a clock board "separate" from other boards and/or the remainder of the computer system. In addition, a feedback output from each fanout buffer (CLK1_BUF1_FB, CLK1_BUF2_FB, CLK2_BUF1_FB, CLK1_BUF2_FB) is routed to MUX1 104 matching the same length as the loads. Since the characteristics of fanout buffers 103-1 to 103-4 allow for very tight skew control for each output (preferably 0 ps), the feedback clock signals will arrive at MUX1 104 at the same time that the other clock signals arrive at their system loads.

The output of MUX1 104 drives one input of phase detector 106. Similarly, reference clocks CLK1_REF and CLK2_REF are input into MUX2 105, whose output drives the other input of phase detector 106. Phase detector 106 outputs digital pulses whose width is proportional to the phase error. These pulses are filtered and amplified in the Filter & Gain Stage 107 to convert the phase error information into a voltage for the Analog to Digital converter 108-1. This operation is under the control of microcontroller 108 via control bus 109.

Control bus 109 is associated with circuitry (not shown) which decodes local bus addresses to provide latch enable signals to clock source 101, programmable delay elements 102, a frequency counter, and a LED display (not shown) as well as driving and reading configuration pins of various selectable devices at DC levels. There may also be control signals for selection of clock signal families or groups. This is because a user may want to check only one clock signal family or group, and microcontroller 108 may accept only a single asynchronous external clock source that must be externally divided down by an appropriate value.

The example embodiment in FIG. 1 provides a method of automatically eliminating skew in large clock distribution networks or, at least, holding the skew between all clocks to less than about 40 or 50 ps. The circuitry is capable of accurately determining the phase relationship between multiple clock signals of the same frequency and adjusting individual delays of those signals to minimize their skew. It does this by constantly monitoring the system level skew and automatically adjusting the programmable delay chips. When an out of tolerance condition is detected, the system either warns the operator of the condition and/or automatically re-adjust the programmable delay chips.

If a delay update is made to a single clock line while the computer system is operating, the adjustment can potentially occur precisely when the clock is transitioning, resulting in a transient or in a non-monotonic edge which can compromise the rest of the system. Consequently, automatic calibration is preferably performed at the user's selection (such as by pressing a button, etc.). Thereafter, the phase skews will be constantly measured (within either families or groups) and visual indicators may signal to the user that re-calibration is necessary due to skew measurements exceeding a certain range.

During automatic calibration, microcontroller 108 periodically compares each clock in a plurality of clock signals (such as a smaller clock group or family) against the reference signal for that plurality of clock signals (such as a family's reference signal clock) and determines the one clock signal that has the longest delay. It then automatically adjusts the delay values of the programmable delay elements 102 of all other clocks in the plurality of clock signals (or in the smaller clock group or family) to match the delay of the one clock signal that has the longest delay in order to minimize skews, match phase error and maintain frequency offsets within a family or group of clock signals. The clock signals in the process may include various numbers of groups of clock signals. For example, there may be one or more clock families derived from a single common clock source.

The functionality of phase detector 106 is similar to that of phase comparators used in phase-locked loops. A simple iterative algorithm can be employed to minimize the skew, as long as the skew is relatively small.

Figure 2:
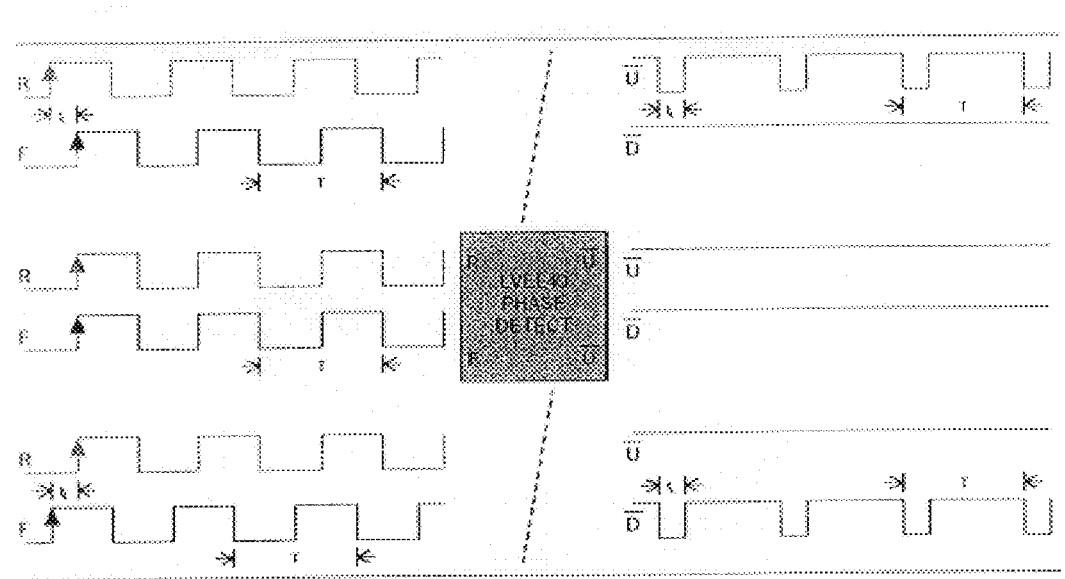
FIG. 2 is an illustration of a phase-frequency detector operation.
Figure 3:
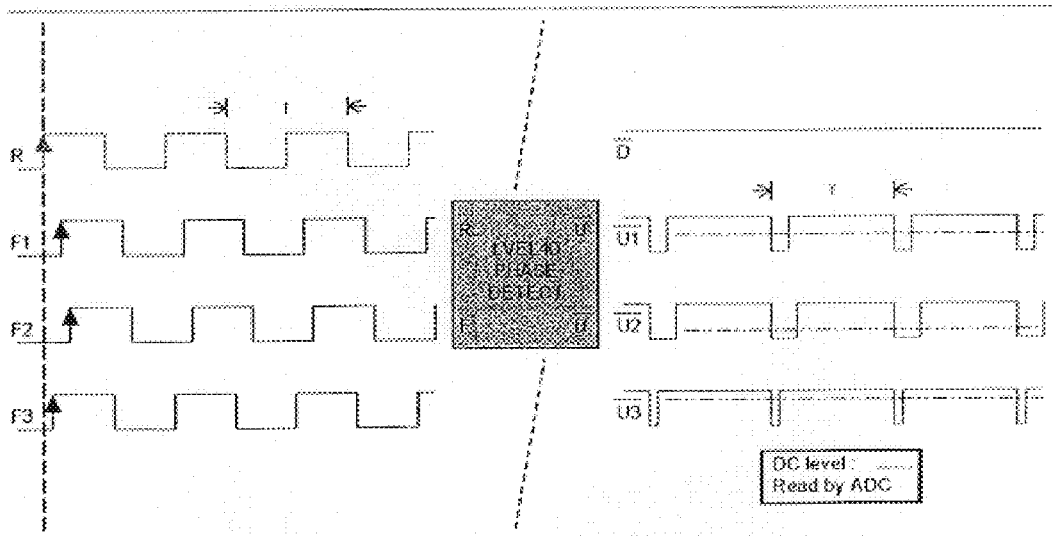
FIG. 3 is another illustration of the phase-frequency detector operation.

FIGS. 2 and 3 illustrate an exemplary operation used in conjunction with phase detector 106. If the reference clock leads as shown at the top left of FIG. 2, then the down output (D) will be a monotonous high signal while the Up output (U) will toggle at a duty cycle proportional to the magnitude of the phase difference as shown at the top right of FIG. 2. In the reverse case when the feedback clock leads as shown at the bottom left of FIG. 2, the Up (U) output will be monotonously high while the Down output (D) will toggle as shown at the bottom right of FIG. 2. The behavior is stable in marginal cases. If both clock signals are perfectly in phase as shown in the middle of the left half of FIG. 2, then the Up and Down output will be monotonously high as shown in the middle of the right half of FIG. 2. If the clock signals are 180 degrees out-of-phase, then the Up and Down outputs will both toggle at 50%. If a plurality of feedback signals are provided for a single reference clock signal as shown in the example of FIG. 3, then a plurality of corresponding Up (U) output signals can be output by phase detector 106.

The algorithm that is preferably implemented in microcontroller 108 to carry out this operation is a two pass process. The first pass determines which fanout buffer in the same clock frequency has the longest delay compared to the reference clock. The second pass will then incrementally adjust the delays to the fanout buffers until the two are matched. The very first time this algorithm is run, all programmable delays are set to zero. In subsequent executions, this algorithm changes the settings in the programmable delays. A version of this algorithm is represented in the following pseudo code. Of course, several different software implementations are possible that can yield similar results.

```
PASS 1
For n=1 to NumClocks
    MaXDelay(n) = 0
    Set MUX2 select for CLKn__REF
    For m=1 to NumBuffers
        Set MUX1 select for CLKn__BUFm__FB
        Delay (m) = A2D__Output
        If Delay (m)>MaXDelay(n) then MaXDelay(n)=Delay(m)
    Next m
Next n
PASS 2
For n=1 to NumClocks
    Set MUX2 select for CLKn__REF
    For m=1 to NumBuffers
        Set MUX1 select for CLKn__BUFm__FB
        While A2D__Output<MaXDelay(n) Increment DELAYn__m
        While A2D__Output>MaXDelay(n) Decrement DELAYn__m
    Next m
Next n
```

The accuracy of this scheme is dependent upon the resolution of A to D converter 108-1, the sensitivity of phase detector 106 and the sensitivity of Filter & Gain Stage 107. With a full range (360 degrees) phase detector 106, a 10 nsec clock and a 9 bit A to D converter 108-1, the skew accuracy is less than 20 ps. The following equation calculates the skew accuracy for a given implementation:

$$\text{Skew} = \frac{PhaseDetectorRange \text{ (Degrees)}}{360 \text{ Degrees/cycle}} \times \frac{ClkPeriod \text{ (ns/Cycle)}}{2^n}$$

Of course, the example embodiments of the invention are not limited to personal computers. Indeed, the invention may be used in any processing device employing a large number of clock signals.

Other features of the invention may be apparent to those skilled in the art from the detailed description of the exemplary embodiments and claims when read in connection with the accompanying drawings. While the foregoing and following written and illustrated disclosure focuses on disclosing exemplary embodiments of the invention, it should be understood that the same is by way of illustration and example only, is not to be taken by way of limitation and may be modified in learned practice of the invention. While the foregoing has described what are considered to be exemplary embodiments of the invention, it is understood that various modifications may be made therein and that the invention may be implemented in various forms and embodiments, and that it may be applied in numerous applications, only some of which have been described herein. It is intended by the following claims to claim all such modifications and variations.

What is claimed is:

1. An automatic clock calibration circuit comprising:
   a source of a plurality of clock signals and a plurality of clock reference signals respectively corresponding to said plurality of clock signals;

a plurality of delay elements respectively corresponding to said clock signals and connected between said source and loads driven by said plurality of clock signals;

a phase frequency detector detecting the phase difference between one of said plurality of clock signals, at the point at which said clock signals are applied to a load, and its corresponding one of said plurality of clock reference signals; and a microcontroller adjusting the delay of said plurality of delay elements according to the detected phase difference.

2. The automatic clock calibration circuit recited in claim 1, wherein the plurality of clock signals consists of a plurality of different clock groups.

3. The automatic clock calibration circuit recited in claim 2, wherein the clock groups consist of clock families derived from a single common clock source.

4. The automatic clock calibration circuit recited in claim 1, wherein the microcontroller continuously monitors the clock signals.

5. The automatic clock calibration circuit recited in claim 4, wherein said plurality of delay elements comprise a plurality of programmable delay elements and the microcontroller automatically adjusts the delay of the programmable delay elements when an out of tolerance condition is detected.

6. The automatic clock calibration circuit recited in claim 4, wherein the circuit warns the user when an out of tolerance condition is detected.

7. The automatic clock calibration circuit recited in claim 1, further comprising a first multiplexer receiving and selectively outputting one of the control signals at the point at which the clock signals are applied to the load.

8. The automatic clock calibration circuit recited in claim 7, further comprising a second multiplexer receiving and selectively outputting one of the clock reference signals.

9. The automatic clock calibration circuit recited in claim 8, further comprising a plurality of fanout buffers, each receiving a single clock signal and providing a plurality of output clock signals.

10. The automatic clock calibration circuit recited in claim 9, wherein one of the output clock signals provided by each fanout buffer is provided to said first multiplexer.

11. An automatic clock calibration method comprising:

generating a plurality of clock signals and a plurality of clock reference signals respectively corresponding to said plurality of clock signals;

controllably delaying each of said clock signals before it is provided to a load driven by each of said clock signals;

detecting the phase difference between one of said plurality of clock signals, at the point at which said clock signals are applied to the load, and its corresponding one of said plurality of clock reference signals; and adjusting the delay of each of said clock signals before according to the detected phase difference.

12. The automatic clock calibration method recited in claim 11, wherein the plurality of clock signals have different frequencies.

13. The automatic clock calibration circuit recited in claim 11, wherein the plurality of clock signals consists of a plurality of clock families derived from a single common clock source.

14. The automatic clock calibration circuit recited in claim 11, wherein the clock signals are continuously monitored.

15. The automatic clock calibration circuit recited in claim 14, wherein the delay of the clock signals is automatically adjusted when an out of tolerance condition is detected.

16. The automatic clock calibration circuit recited in claim 14, wherein the user is warned when an out of tolerance condition is detected.

17. The automatic clock calibration circuit recited in claim 11, wherein an iterative algorithm is performed by a microcontroller to detect the phase differences.

18. The automatic clock calibration circuit recited in claim 17, wherein the iterative algorithm first determines which clock signal has the longest delay compared to its respective reference clock and then incrementally adjusts the delay of the remaining clock signals until they are equal.

* * * * *